United States Patent [19]
Johnson

[11] 3,974,365
[45] Aug. 10, 1976

[54] RADIO ALTIMETER RATE LINEARIZER

[75] Inventor: Lee A. Johnson, Marion, Iowa

[73] Assignee: Rockwell International Corporation, El Segundo, Calif.

[22] Filed: Sept. 26, 1975

[21] Appl. No.: 617,114

[52] U.S. Cl............................ 235/151.32; 235/150.2; 340/27 R; 343/12 A
[51] Int. Cl.²...................... G06G 7/28; G06G 7/78
[58] Field of Search................... 235/150.2, 151.32; 340/27 R, 27 NA; 343/7 A, 12 A

[56] References Cited
UNITED STATES PATENTS

| | | | |
|---|---|---|---|
| 3,662,163 | 5/1972 | Miller et al. | 235/150.3 X |
| 3,761,946 | 9/1973 | Johannessen et al. | 343/12 A |
| 3,790,910 | 2/1974 | McCormack | 235/151.3 X |

Primary Examiner—Jerry Smith
Attorney, Agent, or Firm—Richard W. Anderson; Robert J. Crawford

[57] ABSTRACT

A method and means for obtaining a linear rate of change signal from an input analog signal whose magnitude exhibits a logarithmic amplitude variation over at least a portion of the range of the independent variable defining said signal. The nonlinear rate of change of the input signal is obtained by differentiation, and the resulting nonlinear rate signal is multiplied by the nonlinear function of the dependent variable defining the input signal, which function is implemented in accordance with that defined from a mathematical differentiation of the expression defining the nonlinear characteristic of the input signal.

15 Claims, 9 Drawing Figures

RADIO ALTIMETER RATE LINEARIZER

This invention relates, generally, to a method and means for extracting linear rate of change data from a signal whose magnitude exhibits a logarithmic characteristic over at least a portion of the range through which the signal is variable. More particularly, this invention relates to a means for obtaining linear rate information from the output of a radio altimeter, which varies with ratio height above ground terrain in a predetermined logarithmic fashion.

The output from a radio altimeter, by defined ARINC characteristic, exhibits a logarithmic characteristic rather than a linear characteristic for outputs in excess of a predetermined radio height. Beneath this predetermined radio height, the output is defined as a linear variation. The logarithmic characteristic of the radio altimeter output has been established such that when displaying radio altimeter altitude on an indicator, the uppermost portion of the range, which exhibits a defined logarithmic variation, may be displayed on a predetermined relatively small portion of an indicating dial, while altitudes of a more critical nature, for example 0 to 500 feet, are displayed in a linear fashion over a major expanse of the indicator dial.

While the ARINC characteristic defined output of a radio altimeter is useful for the intended indicator display purpose, ofttimes in avionics control systems and equipments, the radio determined altitude, as well as the rate of change thereof, are utilized for threshold inputs in various computations. When altimeter derived altitude and altitude rate is to be utilized for comparison with analog profiles, and it is understandably desirable to implement linear analog profiles, the output from the radio altimeter must be linearized. Present linearization is obtained by techniques which define the output characteristic as a series of best contiguous straight-line segments. Linear operational amplifiers may then be employed with appropriate gains, saturation characteristics and offset biases, to collectively provide an output which quite closely approximates a linear characteristic over the entire range. For example, it has been found that defining the output of a radio altimeter in terms of four contiguous straight-line segments, in applying linearization techniques, is sufficient to obtain a linearity with 5% accuracy over the range.

When, however, it is desired to determine the rate of change of radio altitude by differentiation of linearized radio altitude, a 5% linearity accuracy as concerns the radio altitude will exhibit itself as greater than 30 percent as concerns the rate of change, since the straight-line approximation technique employed to linearize the altitude signal introduces a considerable error when the rate of change of this signal is derived by differentiation.

It has been found, for example, that to employ straight-line segment linearization techniques to the nonlinear output of a radio altimeter sufficiently accurate that the rate signal obtained by differentiation of this linearized signal would be within 5 percent of linearity, would require that 15 or more straight-line segments be employed in the radio altitude linearization process. Since commonly employed techniques define, implementationwise, an operational amplifier for each of the straight-line segments employed in the altitude linearization technique, considerable hardware would have to be employed in order that the radio altimeter output signals so linearized might be directly differentiated to obtain a linear rate signal of desired accuracy.

Accordingly, an object of the present invention is to provide a radio altimeter rate linearizer which responds to a linearized radio altitude signal and generates a linearized rate output signal which exhibits the same percentage linearity accuracy as the linearized altitude signal.

A further object of the present invention is to provide a radio altimeter rate linearizer technique and implementation thereof wherein radio altitude rate obtained from differentiation of nonlinear radio altitude may be operated on by a function of linearized altitude to obtain a radio altitude rate output signal with the same linearity accuracy as the linearized altitude signal.

The present invention is featured in the provision of circuitry which differentiates nonlinear radio altimeter derived altitude and then linearizes the resulting nonlinear radio altitude rate signal in accordance with the particular mathematical function which defines the nonlinear relationship between differentiated nonlinear radio rate and linearized altitude as obtained from examination of the mathematical relationship defining the non-linear characteristic of the radio altimeter altitude input signal.

These and other features and objects of the present invention will become apparent by reading the following description with reference to the accompanying drawings in which.

The present invention will be described as it applies to obtaining linear radio rate from nonlinear radio altimeter output signals. In a general sense the linearization technique to be described is applicable to obtaining a linear rate signal from any displacement signal which varies as a logarithmic function of the independent variable.

Figure 1:
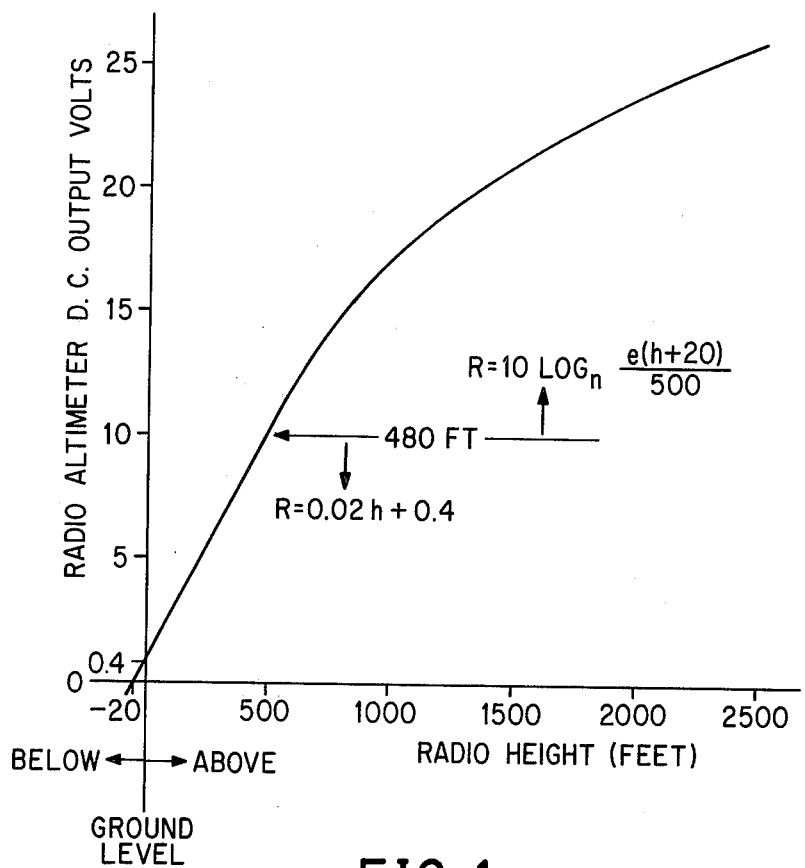
FIG. 1 is a representation of the electrical characteristic which defines the output from a radio altimeter as established by ARINC specifications.

The output from a radio altimeter in DC volts is a linear function up to a predetermined altitude and thereafter varies as a logarithmic function of radio height. FIG. 1 illustrates the ARINC defined characteristic of the output from a radio altimeter. The output varies linearly up to 480 feet of altitude and thereafter as a logarithmic function of radio height. Referring to FIG. 1, below 480 feet, the radio output is defined as:

$$R = 0.02 h + 0.4 \quad (1)$$

Above 480 feet the radio altimeter output in volts is defined as:

$$R = 10 \log_n \frac{e(h+20)}{500} \tag{2}$$

When the output is to be utilized in linear analog signal processing, the output from the radio altimeter must be linearized over the entire range.

Figure 2:
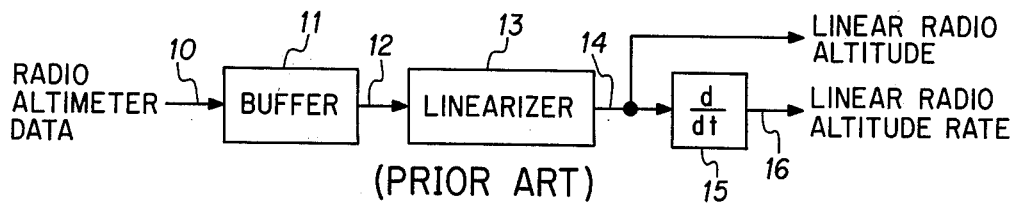
FIG. 2 is a functional diagram of a prior art method of obtaining linear radio altitude rate from radio altimeter input data.

FIG. 2 functionally illustrates the currently employed method of operating on nonlinear radio altimeter output to obtain linear radio altitude output, by differentiation of the linearized radio altitude signal to obtain a linear radio altitude rate output. Radio altimeter output 10 is indicated as being applied to a buffer 11 with the output 12 from buffer 11 being applied to a linearizer 13. The output 14 from linearizer 13 comprises the linear radio altitude signal. Various techniques commonly employed in the art approximate the nonlinear radio altimeter DC input 10 as a series of contiguous straight-line segments and may employ a like number of operational amplifiers with appropriate offsets and saturation level characteristics to develop a linear output 14 which varies ideally as a constant slope linear function throughout the range. In practice, a linear radio altitude signal 14 with 5% linearity accuracy may be linearized by using a four straight-line segment approximation of the characteristic depicted in FIG. 1. If, however, it is desirable to develop from this 5% accurate linear radio altitude signal a rate of change signal, the application of the signal 14 to a differentiator 15 will develop a radio altitude rate signal 16 which may only be 20 to 30 percent accurate due to the rate errors caused by the straight-line approximation technique employed in linearizer 13. As above discussed, the technique of successive contiguous straight-line segments to approximate the characteristic of FIG. 1 would necessitate in excess of fifteen such contiguous line segments to obtain a linearized radio altitude signal 14 which could be differentiated to obtain a linear radio altitude rate signal with 5 percent accuracy.

The present invention will be seen to provide a linearization means wherein the accuracy of the radio rate signal is not subject to error caused by the radio altitude linearizer but instead makes use of linear altitude which has good accuracy. Stated another way, the radio rate linearization technique to be described herein permits a radio rate signal to be derived by a technique employing linearized radio altitude; the rate linearity inaccuracy is not compounded by the linearized radio altimeter data; that is, the system employs a linearized radio altitude signal of predetemined accuracy in a signal processing means to obtain a radio rate output signal the accuracy of which is essentially the same as that of the linearized altitude signal.

The technique of the present invention evolves from an examination of the equations descirbing the radio altitude signal characteristic as depicted in FIG. 1.

With reference to FIG. 1, one sees that in the linear region below 480 feet, the radio altitude signal is expressed as:

$$R = 0.02 h + 0.4$$

Differentiating the above expression, the following relationship exists:

$$\frac{dR}{dt} = 0.02 \frac{dh}{dt} \tag{3}$$

In the nonlinear region of the curve depicted in FIG. 1, the radio altitude is defined as:

$$R = 10 \ln (h+20) - 52.1461 \tag{4}$$

Differentiating the above expression, arrives at the following relationship:

$$\frac{dR}{dt} = \frac{10}{h+20} \frac{dh}{dt} \tag{5}$$

Rearranging the above equations and solving for $dh/dt$, which is linear altitude rate, the following expression is defined by the linear region of the characteristic:

$$\frac{dh}{dt} = 50 \frac{dR}{dt} \tag{6}$$

In the nonlinear region of the characteristic, the following expression is defined:

$$\frac{dh}{dt} = \frac{h+20}{10} \frac{dR}{dt} \tag{7}$$

Thus, if the radio altimeter is first differentiated, and then is linearized according to expressions (6) and (7), linear altitude rate can be obtained.

Below 480 feet of altitude, linear altitude rate is defined as the product of a constant and the derivative of radio altitude $R$ with respect to time. In the nonlinear region, linear altitude rate is defined as the product of a function of linear radio altitude $h$ and the derivative of the radio altitude $R$ with respect to time.

Figure 3:
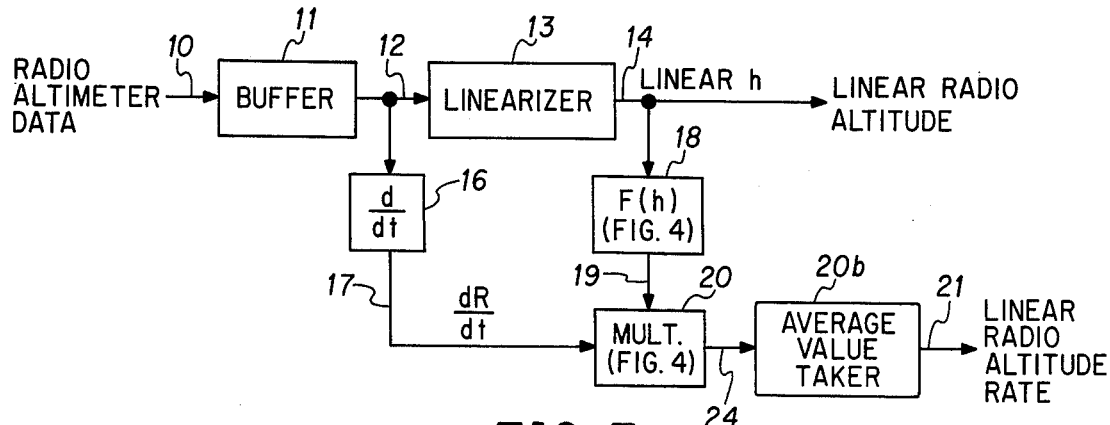
FIG. 3 is a functional block diagram of the improved radio altimeter rate linearizer in accordance with the present invention.

FIG. 3, in a general functional manner, illustrates the manner in which radio altimeter input data 10 is operated on to obtain linearized radio altitude, and how a function of this linear radio altitude and the derivative of the radio altimeter input data is applied to a multiplier to subsequently obtain a linear radio altitude rate output signal by processing the nonlinear radio rate signal obtained from differentiation of radio altimeter input data as particular functions of linear radio height $h$ in accordance with the above-defined expressions (6) and (7). In general, and with reference to FIG. 3, the nonlinear radio rate signal 17 is applied to multiplier block 20, which, as will be further described, may be embodied as a variable gain amplifier. In the absence of the $f(h)$ input 19 to the multiplier block 20, the amplifier contained therein would merely amplify the nonlinear radio rate signal by a predetermined gain. Linearization of the nonlinear radio rate signal 17 applied to the multiplier block 20, however, is uniquely accomplished by development, within the $f(h)$ block 18, of a switching waveform, the duty cycle of which is a function of linear radio height over the nonlinear portion of the curve. If this variable duty cycle waveform is then used to switch the gain of the amplifier within multiplier block 20 between predetermined levels in accordance with the duty cycle waveform input, the output 24 from the multiplier comprises a square wave signal the average value of which comprises linearized radio altitude rate. The output 24 from multiplier block 20 in FIG. 3 is applied to an average value taker 20b the output 21 of which comprises a DC linear radio altitude rate signal, linearized in accordance with the above expressions (6) and (7) for the respective linear and nonlinear regions of the characteristic of FIG. 1.

the manner in which the $f(h)$ block 18 and multiplier block 20 of FIG. 3 operate to perform the linearization in accordance with expressions (6) and (7) will become apparent from a further consideration of the particular embodiments of the $f(h)$ block 18 and the multiplier block 20.

Figure 4:
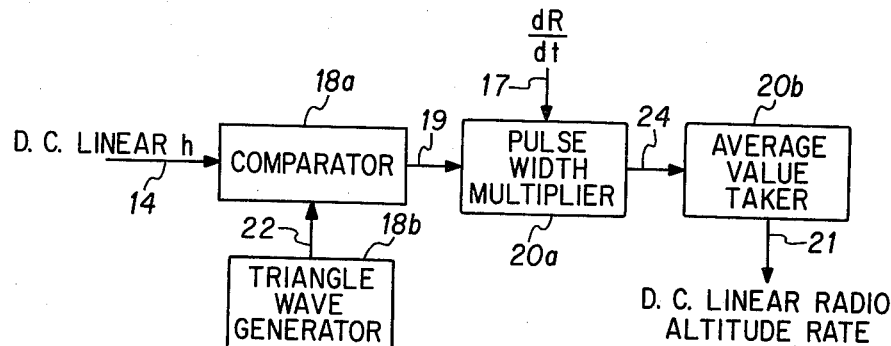
FIG. 4 is a more detailed functional block diagram of the circuitry of FIG. 3.

Referring to FIG. 4, the $f(h)$ 18 may comprise a voltage comparator 18a receiving as respective inputs the linearized radio altitude signal 14 and the output 22 from a triangle wave generator 18b. With appropriate scaling of the voltage range excursion of the triangular wave as applied to comparator 18a, the output 19 from voltage comparator 18a, in response to altitude signals over the nonlinear range of the altimeter output, becomes a square wave signal, the pulse repetition rate of which is defined by that of the triangle wave generator 18b and the duty cycle of which is uniquely defined by the particular magnitude of the linear altitude input signal 14 as compared to the triangle wave as applied to the comparator. Output 19 from voltage comparator 18a might comprise a signal varying between first and second logic levels, 0 and 1. If, then, this variable duty cycle bilogic level output 19 from comparator 18a is applied to an amplifier embodied in pulse width multiplier block 20a to which the nonlinear radio rate signal 17 is applied as input, and the amplifier within multiplier block 20a is responsive to the logic levels of the variable duty cycle output waveform from comparator 19 to change gain, the output signal from the amplifier within multiplier block 20a may be made to comprise a square amplitude modulated signal. The amplitude of this output signal is defined by the amplitude of the radio rate signal 17 applied to the input of the multiplier, and the average value of this output comprises a linear DC radio altitude rate signal.

The manner in which the functionally depicted system of FIG. 4 operates to linearize the nonlinear radio rate signal 17 in accordance with the predetermined functions of linear altitude signal 14 may best be comprehended from a consideration of particular implementations of the functional blocks of FIG. 4.

Figure 5:
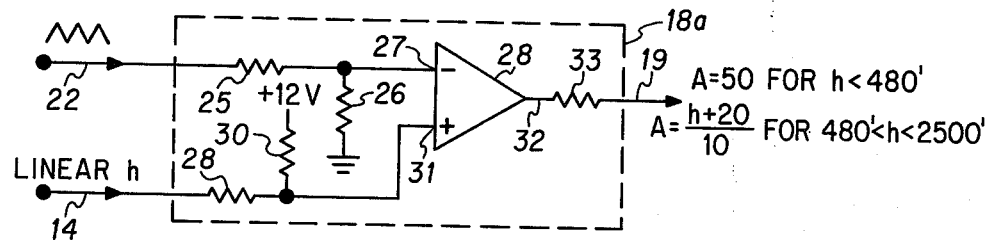
FIG. 5 is a schematic diagram of an implementation of the comparator functional block of FIG. 4.

FIG. 5 illustrates an implementation of the voltage comparator block 18a of FIG. 4. The output 22 from the triangle wave generator is applied through resistive network 25–26 as input 27 to the inverting input terminal of an operational amplifier 28. The linear radio altitude signal 14 is applied through a resistive network 29–30 as an input 31 to the noninverting input terminal of operational amplifier 28, with input resistor 30 being tied to a positive bias source. Output 32 from operational amplifier 28 is applied through an output resistor 33 to supply the logic level defined square wave output 19, having a duty cycle which varies as a function of the magnitude of the linear altitude input signal 14 to the comparator.

Figure 6:
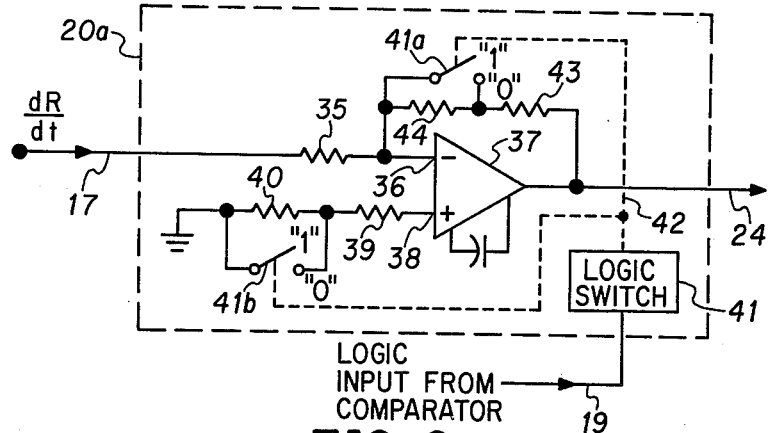
FIG. 6 is a schematic diagram of an implementation of the pulse width multiplier functional block of FIG. 4.

FIG. 6 is a schematic implementation of the pulse width multiplier block 20a of FIG. 4. The pulse width multiplier comprises an operational amplifier 37 with the radio altimeter rate signal 17 being applied through resistor 35 as input 36 to the inverting input terminal. The noninverting input terminal of operational amplifier 37 is tied to ground through series resistors 39 and 40, with resistor 40 being shunted by a shorting switch 41b. A feedback network comprised of resistors 43 and 44 is tied between the output 24 of operational amplifier 37 and the inverting input terminal thereof, with resistor 44 in this feedback circuit being shunted by a shorting switch 41a. As indicated in FIG. 6, each of the switches 41a and 41b is selectively operable to open and closed positions in response to respective logic 1 and logic 0 levels of the voltage comparator output 19. As indicated functionally in FIG. 6, the voltage comparator logic level output, previously described as having a duty cycle defined as a function of linearized radio altitude signal, is applied to a logic switch 41 to effect opening and closing, through the functional interconnection 42, of each of the shorting switches 41a and 41b. The switch sections 41a and 41b might be embodied as electronic solid state switching devices. Since the gain of operational amplifier 37 is proportional to the ratio of the feedback and input resistances, it is apparent that, by selective choice of values of resistors 43 and 44 in the feedback loop, the gain of operational amplifier 37 may be made to change between first and second defined values, depending upon whether the logic switch 41a is opened or closed. Switch 41b selectively adjusts input resistance to maintain a balance of offset current impedances as the feedback resistance is changed. It is further apparent that since the logic level waveform obtained from the voltage comparator, which determines the positions of the logic switches 41a and 41b, is defined as having a duty cycle proportional to linearized altitude, the average gain of operational amplifier 37 varies in accordance with the duty cycle of the voltage comparator output waveform. If, then, the gain of operational amplifier 37 is chosen to be a maximum for maximum linearized altitude input to the system, and a predetermined minimum for the 480 foot altitude level, and the average gain of operational amplifier 37 be made to vary as the defined logarithmic function of linear radio altitude between these limits, the output 24 from operational amplifier is radio altitude rate linearized in accordance with above expressions (6) and (7).

Figure 7:
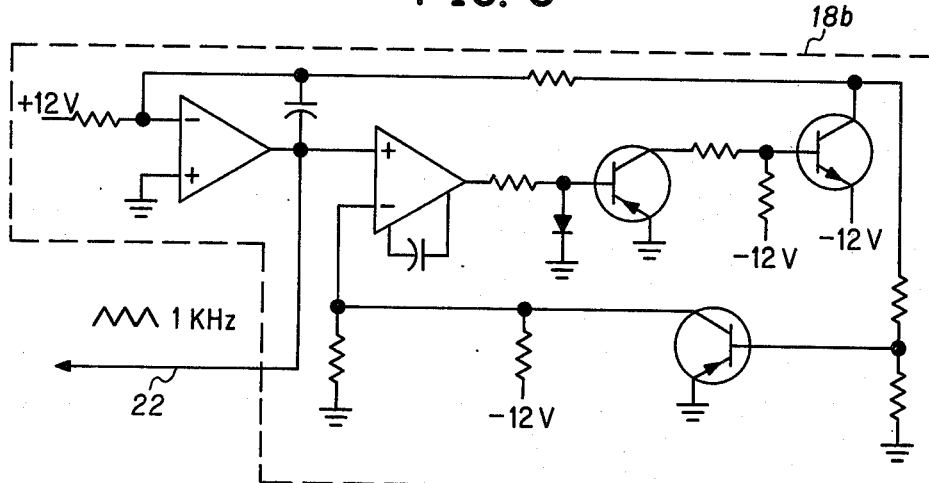
FIG. 7 is a schematic diagram of an implementation of the triangle wave generator block of FIG. 3.

FIG. 7, depicts schematically a circuitry which might be utilized to implement the triangle wave generator 18b of FIG. 4. The generator might be implemented in a number of ways. The output waveform 22 thereof would comprise a triangular waveform at some desired repetition rate which varies between respective maximum and minimum voltage levels. As applied through resistance network 25–26 to the input terminal 27 of comparator 18a (FIG. 5), this waveform is scaled to correspond to the voltage values of linearized radio altitude 14 for radio heights corresponding to 2500 feet and 480 feet (the respective heights defining the extremes of the logarithmically varying portion of the radio altimeter output characteristic).

Figure 8:
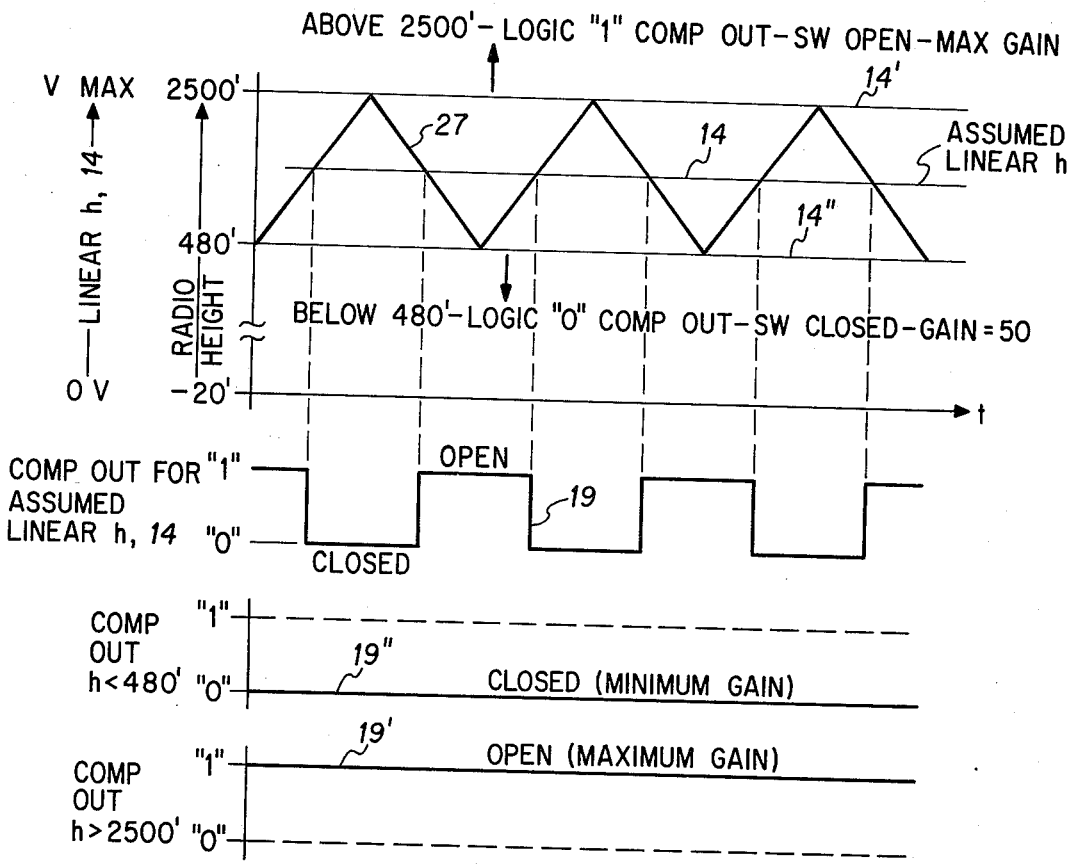
FIG. 8 is a diagrammatic representation of waveforms showing operating characteristics of the invention.

FIG. 8 diagrammatically represents the manner in which the aforedefined circuitry affects a linearization of radio rate obtained from nonlinear radio altimeter input data. The triangle wave 27, as applied to the comparator input, is illustrated as a continuously varying symmetrical triangular wave the minimum amplitude of which corresponds, scalewise, with the linearized altitude signal 14 for a radio height of 480 feet. The maximum value of the input 27 to the comparator corresponds, scalewise, to the value of linearized radio altitude 14 for the maximum radio height of 2500 feet. Referring again to FIG. 1, the radio heights of 480 feet and 2500 feet correspond to the extremes of the logarithmically varying portion of the characteristic. FIG. 8 depicts an assumed linear radio altitude signal 14, whose magnitude is approximately midway betwen the 480 foot and 2500 foot radio height levels. The output 19 from voltage comparator 18a is depicted in FIG. 8 as varying between logic 0 and logic 1 levels. The output 19 from the comparator is a logic 0 level when the magnitude of the triangular wave applied thereto exceeds that of the linear altitude input to the comparator, and switches to a logic 1 level when the scaled triangular wave falls beneath the linear altitude level. Also depicted in FIG. 8 is a continuous logic 0 output level 19'' from the comparator for linearized radio altitude inputs to the comparator 18a which are less than the minimum value voltage of the scaled triangular wave. A continuous logic 1 output 19' from comparator 18a is depicted for linearized altitude inputs to the comparator which exceed the maximum value of the scaled triangular wave.

It may be seen from FIG. 8, that, as the linear altitude signal 14, as applied to the comparator, increases from that depicted, the duty cycle of the comparator output waveform 19 changes proportionally with the logic 0 level intervals being correspondingly narrower and the logic 1 level intervals being correspondingly wider. Conversely, should the linearized radio altitude signal 14 decrease from that depicted in FIG. 8, the logic 0 portions of the comparator output waveform 19 are correspondingly wider and the logic 1 portions thereof narrower.

Now, if the particular duty cycle of the output 19 from comparator 18a is applied to operate the logic switches in the pulse width multiplier depicted in FIG. 6, such that the operational amplifier 37 exhibits a minimum gain in response to logic 0 levels from the comparator output, and a maximum gain in response to logic 1 output levels from the comparator, and the duty cycle of the comparator waveform within the non-linear range is a direct function of linearized altitude, pulse width multiplier block 20a will provide an output 24 linearized in accordance with the above expressions (6) and (7). Referring to FIG. 6, logic switches 41a and 41b may be implemented so as to be closed in response to logic 0 outputs from the comparator and to be open in response to logic 1 outputs therefrom. The feedback resistance value is then altered by selective inclusion of resistor 44 such that the desired minimum and maximum gains are realized. When the value of linearized radio altitude lies in the nonlinear region of the radio altimeter output characteristic, the duty cycle of the comparator output waveform varies in proper proportion, such that the average gain at which operational amplifier 37 operates, follows the desired $$\frac{h+20}{10}$$

function of the above expression (7). Below 480 feet, the comparator output is held at a constant logic 0 level, and the switch 41a of FIG. 6, remains continually closed to establish the minimum desired gain of 50. Above the maximum 2500 foot altitude level, the output from the comparator is held at a logic 1 level, the switch 41a remains open, and the gain of the operational amplifier is held at a predetermined maximum. If then, the output 24 from the pulse width multiplier, which comprises a pulse width amplitude modulated signal is averaged, a DC value corresponding to linearized radio rate is obtained.

Figure 9:
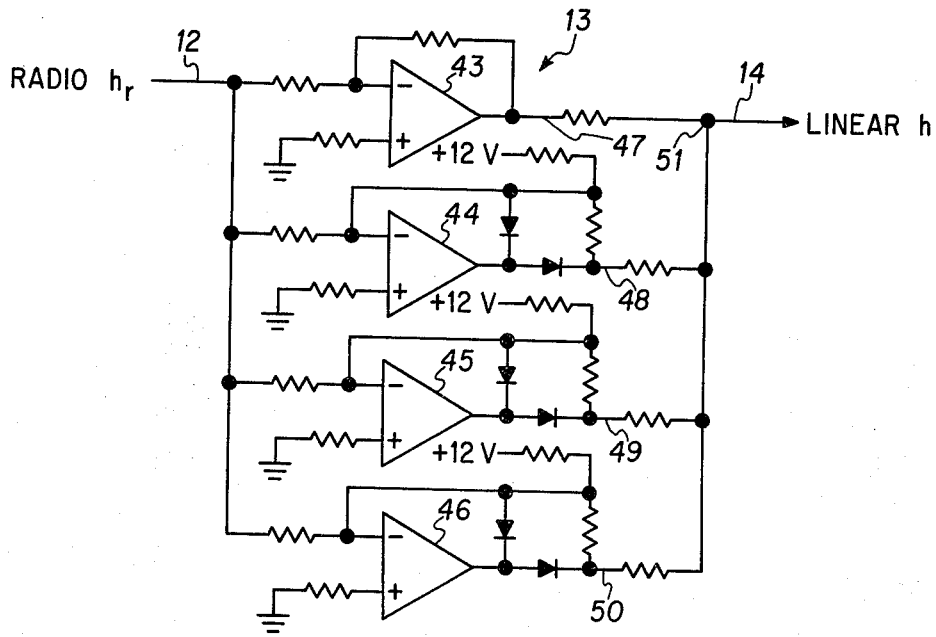
FIG. 9 is a schematic diagram of a radio altimeter output signal linearizer as might be employed.

FIG. 9 depicts an implementation of a technique commonly employed in the art to linearize the nonlinear output from a radio altimeter. Nonlinear radio altitude 12 is applied as input to each of four operational amplifiers 43, 44, 45, and 46. The input and feedback resistances of the respective operational amplifiers may be chosen to effect gains in successive ones of the operational amplifiers such that the summation of the outputs of conducting ones of the amplifiers defines the slope of each of four contiguous straight-line segments chosen to approximate the radio altimeter output characteristic depicted in FIG. 1. Operational amplifier 43 may provide a linear output up to 480 feet, for example, to provide a first segment. Operational amplifier 44 may be chosen with appropriate offset bias such that the diodes associated therewith are forward biased to produce an output from amplifier 44 of predetermined gain when the input 12 reaches a first predetermined level. In the same manner, operational amplifier 45 may be provided with appropriate offset bias such that the diodes associated therewith are forward biased when the input 12 reaches a second predetermined level to provide an output 49 therefrom at a predetermined gain to define the third contiguous straight-line segment. Operational amplifier 46 may similarly be offset biased such that the diodes associated therewith are forward biased when the input 12 reaches a third predetermined level, whereupon operational amplifier 46 provides an output 50 at a predetermined gain to define a fourth contiguous straight-line segment. The outputs from the four operational amplifiers 43–46 are summed at 51, and the composite output 14 comprises a linearized radio altitude output signal 14. It has been found that the use of four contiguous straight-line segments to approximate the characteristic of FIG. 1 results in a linear output of 14 with 5 percent accuracy.

By the present invention, the same degree of accuracy may be obtained in a linearized altitude rate output signal by utilizing the linearized radio altitude signal to operate on a nonlinear radio rate signal obtained by direct differentiation of the output from the radio altimeter.

Although this invention has been described with respect to a particular embodiment thereof, it is not to be so limited, as changes might be made therein which fall within the scope of the invention as defined in the appended claims.

What is claimed is:

1. Means processing a linearized rate output signal from the nonlinear output of a radio altimeter comprising, signal linearizing means receiving the output of said radio altimeter and providing a linearized radio altitude output signal, signal differentiating means receiving the output of said radio altimeter and providing a nonlinear radio altitude rate output signal, signal processing means receiving said linearized radio altitude signal and developing a two-level binary output signal with duty cycle proportional to said linearized radio altitude signal level between linearized radio altitude signal levels respectively indicative of defined nonlinear radio altimeter output levels corresponding to the extremes of the logarithmically varying segment of the output characteristic of said radio altimeter and including means to hold said binary level output signal at respective ones of said binary levels in response to the linearized radio altitude input levels exceeding and being less than said defined levels, signal amplifying means receiving said nonlinear radio altitude rate signal as input thereto and comprising gain changing means receiving and responsive to the output of said signal processing means to exhibit first and second discrete gain levels respectively in response to the respective binary levels of the output of said signal processing means, and the output of said signal amplifying means comprising said linearized rate output signal.

2. Means as defined in claim 1 wherein said signal processing means comprises a voltage comparator and a triangular wave generator, said voltage comparator receiving said linearized radio altitude signal and the output of said triangular wave generator as respective inputs thereto, with the output of said voltage comparator comprising said two-level binary output signal.

3. Means as defined in claim 2 wherein said signal amplifying means comprises an operational amplifier having selectively variable feedback and input resistance means, and means to selectively change the ratio of the resistances of said feedback and input resistance means between first and second levels in response to the respective first and second binary levels exhibited by the output of said signal processing means.

4. Means as defined in claim 3 wherein said means to selectively change the ratio of feedback and input resistance comprises switching means responsive to the output of said signal processing means, and in circuit with at least one of said feedback and input resistance means, to alter the resistance thereof between first and second values.

5. Means as defined in claim 4, further comprising signal averaging means receiving the output of said signal amplifying means, with the output of said signal averaging means comprising said linearized radio altimeter rate output signal.

6. Means as defined in claim 2 wherein said triangular wave generator output comprises a symmetrical triangular waveform of predetermined repetition rate varying in magnitude between first and second voltage levels respectively corresponding to the voltage levels of said linearized radio altimeter signals which define the respective extremes of the nonlinear characteristic portion of the output of said radio altimeter.

7. Means as defined in claim 1 wherein said signal amplifying means comprises an operational amplifier having feedback and input resistance means, and means to selectively change the ratio of the resistances of said feedback and input resistance means between first and second levels in response to the respective first and second binary levels exhibited by the output of said signal processing means.

8. Means as defined in claim 7 wherein said means to selectively change the ratio of feedback and input resistance comprises switching means responsive to the output of said signal processing means, and in circuit with at least one of said feedback and input resistance means, to alter the resistance thereof between first and second values.

9. Means as defined in claim 1, further comprising signal averaging means receiving the output of said signal amplifying means, with the output of said signal averaging means comprising said linearized radio altimeter rate output signal.

10. Means for processing a linear rate signal from a nonlinear rate of change signal obtained by differentiation of a displacement signal R which exhibits a logarithmic output characteristic over a predetermined displacement range, the time derivative of said displacement signal being defined as $$\frac{dR}{dt} = f(x)\ \frac{dx}{dt},$$

where $x$ represents the actual displacement; comprising signal linearizing means receiving said displacement signal $R$ and providing a linearly varying output signal $x$ over said predetermined displacement range; signal processing means receiving said linearly varying output signal $x$ and developing a two-level pulse-width-modulated binary output signal with duty cycle proportional to said linearly varying output signal $x$ over said displacement range; signal amplifying means receiving said nonlinear rate of change signal as input thereto and comprising gain changing means receiving and responsive to the output of said signal processing means to exhibit first and second discrete gain levels respectively in response to the respective binary levels of the output of said signal processing means; and the output of said signal amplifying means comprising said linear rate signal.

11. Means as defined in claim 10 wherein said signal processing means comprises a voltage comparator and a triangular wave generator, said voltage comparator receiving said linearly varying output signal $x$ and the output of said triangular wave generator as respective inputs thereto, with the output of said voltage comparator comprising said two-level binary output signal.

12. Means as defined in claim 11 wherein said signal amplifying means comprises an operational amplifier having feedback and input resistance means, and means to selectively change the ratio of the resistances of said feedback and input resistance means between first and second levels in response to the respective first and second binary levels exhibited by the output of said signal processing means.

13. Means as defined in claim 12 wherein said means to selectively change the ratio of feedback and input resistance comprises switching means responsive to the output of said signal processing means, and in circuit with at least one of said feedback and input resistance means, to alter the resistance thereof between first and second values.

14. Means as defined in claim 13 wherein said triangular wave generator output comprises a symmetrical triangular waveform of predetermined repetition rate varying in magnitude between first and second voltage levels respectively corresponding to the voltage levels of said linearly varying output signal $x$ which define the respective extremes of the nonlinear characteristic of said displacement signal $R$.

15. Means as defined in claim 14, further comprising signal averaging means receiving the output of said signal amplifying means, with the output of said signal averaging means comprising said linear rate output signal.

* * * * *